United States Patent [19]

Nishifuji et al.

[11] Patent Number: 5,132,608
[45] Date of Patent: Jul. 21, 1992

[54] CURRENT MEASURING METHOD AND APPARATUS THEREFOR

[75] Inventors: Katsuyuki Nishifuji; Seigo Ando, both of Tokyo, Japan

[73] Assignees: Katsuyuki Nishifuji; Seigo Ando, both of Tokyo, Japan

[21] Appl. No.: 598,918

[22] Filed: Oct. 15, 1990

[30] Foreign Application Priority Data

Nov. 6, 1989 [JP] Japan .................. 1-287363
May 21, 1990 [JP] Japan .................. 2-129174

[51] Int. Cl.$^5$ .............................................. G01R 19/00
[52] U.S. Cl. .............................. 324/99 R; 324/117 R; 324/127
[58] Field of Search ............... 324/99 R, 117 R, 127

[56] References Cited

U.S. PATENT DOCUMENTS

| | | | |
|---|---|---|---|
| 3,882,387 | 5/1975 | Vikstrom | 324/117 R |
| 4,050,013 | 9/1977 | Maddox | 324/117 R |
| 4,255,705 | 3/1981 | Milkovic | 324/127 |
| 4,276,510 | 6/1981 | Tompkins et al. | 324/127 |
| 4,899,103 | 2/1990 | Katzenstein | 324/117 R |

FOREIGN PATENT DOCUMENTS 62-27217 5/1986 Japan .
1161178 12/1987 Japan .

*Primary Examiner*—Walter E. Snow
*Assistant Examiner*—William J. Burns
*Attorney, Agent, or Firm*—Ladas & Parry

[57] ABSTRACT

A current measuring method in which a magnetic sensor is a torodial core having a conductor for carrying a current to be measured passing through the hollow portion of the toroid. A coil on the core is excited with an AC voltage such that the positive and negative voltages induced in the coil are equal in amplitude when the conductor is not carrying current. Current in the conductor generates a change in magnetic flux which change is measured by detecting the algebraic sum of the amplitudes of the positive and negative voltages. Simultaneously, the amplifier output is applied to the input side of the AC voltage or a second coil disposed in the magnetic sensor so as to establish a magnetic equilibrium. Current measuring apparatus according to this invention include two types of apparatus composed of hardware to which the above-mentioned current measuring method is applied.

1 Claim, 5 Drawing Sheets

BIAS AC VOLTAGE
WAVEFORM

WHEN CORE IS IN SUPER-
SATURATION EXCITED
STATE AND EXTERNAL
FLUX IS ZERO $$|V_1| = |V_2|$$

DETECTOR INPUT WHEN
EXTERNAL FLUX IS
PRODUCED $$V_O = V_1 + (-V_2)$$

CURRENT MEASURING METHOD AND APPARATUS THEREFOR

BACKGROUND OF THE INVENTION

1. Field of the Invention

The present invention relates to a current measuring method and apparatus therefor and more particularly to a technique of measuring a DC current or AC current flowing in a conductor in a non-contact manner by use of a magnetic sensor.

2. Description of the Prior Art

Methods heretofore known conventionally for measuring current flow include one in which a part of a current path is separated and an ammeter is connected across the separated current path so as to measure the value of the current.

There is another method in which noting the fact that the flow of current in a conductor produces magnetic flux around the outer periphery of the conductor and that this magnetic flux is proportional to the current flowing in the conductor, the value of the magnetic flux is measured to indirectly measure the value of the current flowing in the conductor.

FIG. 1 is a schematic diagram of one of the prior art current measuring apparatus according to the latter method. In the Figure, numeral 11 designates a magnetic yoke, 1 a conductor in which a current to be measured flows, 12 a magnetic sensor for measuring the magnetic flux in the magnetic yoke 11, 13 an amplifier, 14 a measuring device for receiving the output of the amplifier 13 to indicate a detected value, and 15 DC power sources for driving the amplifier 13.

In the current measuring apparatus constructed as described above, when a current $I_m$ flows in the conductor 1, magnetic flux is produced around the outer periphery of the conductor 1 so that the magnetic flux is converged by the magnetic yoke and detected by the magnetic sensor 12 disposed in the gap of the magnetic yoke thereby converting it to an electric signal. The signal is amplified by the amplifier 13 whose output in turn operates the measuring device 14 to indicate the value of the current flowing in the conductor 1.

However, the conventional current measuring apparatus of the above type involves the following various problems and it is desired to enhance and improve the various efficiencies with a view to overcoming these problems:

(1) Due to the low conversion efficiency of the magnetic sensor for converting to an electric signal the magnetic flux produced in proportion to the value of a current flowing in the conductor, it is impossible to measure small currents and the minimum value of measurable currents by the commercially available products is not less than 100 mA.

(2) Where the current to be measured is an AC current, particularly a high-frequency current, a measuring error is caused due for example to the reduced effective transmissibility and the eddy current loss caused in the magnetic yoke.

(3) While a Hall element is generally used as the magnetic sensor, the Hall element is a semiconductor and therefore it is disadvantageous in that the temperature characteristics are not good, that a complicated circuit is required for ensuring a constant current source drive and so on.

SUMMARY OF THE INVENTION

The present invention has been made with a view to overcoming the foregoing problems and it is an object of the invention to provide a current measuring method and apparatus therefor capable of measuring a current flowing in a conductor in a non-contact manner with higher sensitivity and greater accuracy.

In accordance with one aspect of the present invention, even if the current to be detected is zero, a magnetic sensor is always maintained in an excited condition or "live zero" condition by the application of an AC voltage so that if there is the flow of a small current to be detected, the apparatus responds rapidly to it and the value of the current is measured with higher sensitivity and greater accuracy.

In accordance with another aspect of the present invention, the output of an amplifier providing the above-mentioned measured value is fed back to a magnetic sensor coil or applied to a second coil wound on a toroidal core, thereby maintaining a magnetic equilibrium and producing a stable measured value.

DETAILED DESCRIPTION OF THE PREFERRED EMBODIMENTS

Figure 1:
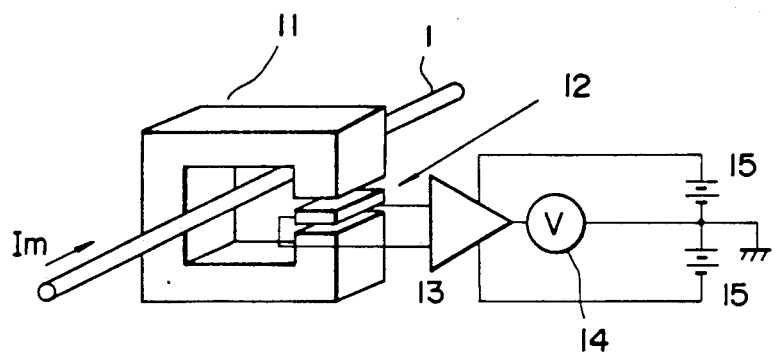
FIG. 1 is a schematic diagram showing the construction of a prior art non-contact type current measuring apparatus.
Figure 2:
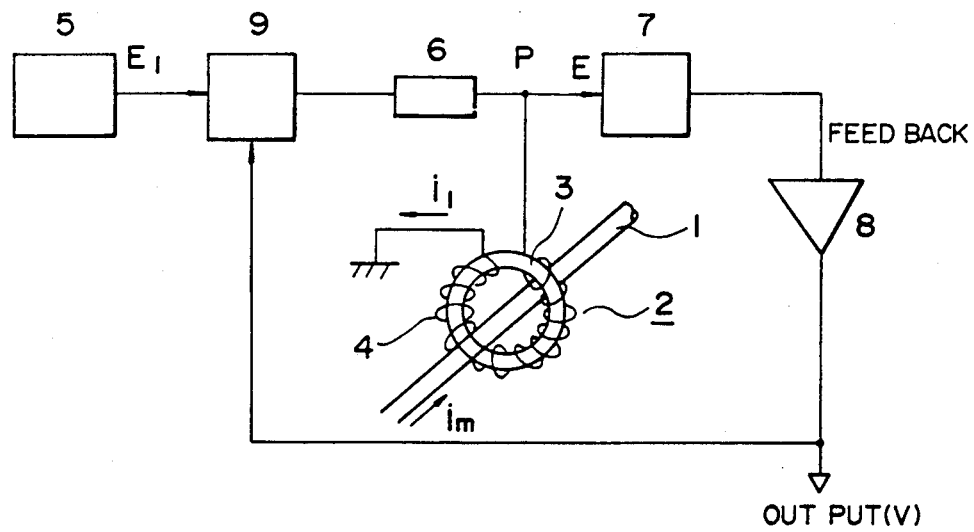
FIG. 2 is a schematic block diagram of an embodiment of the present invention.

FIG. 2 shows the construction of a current measuring apparatus according to an embodiment of the present invention. In the Figure, numeral 1 designates a conductor in which a current to be measured flows, 2 a magnetic sensor composed of a toroidal core 3 and a coil 4 wound on the core 3, 5 an AC oscillator, 6 a series impedance, 7 a detector, 8 an amplifier, and 9 an adder for producing the sum of the AC voltage input from the AC oscillator 5 and the output voltage of the amplifier 8.

It is to be noted that where an AC current is for example to be measured, the frequency of an AC voltage generated from the AC oscillator 5 is selected at least greater than 10 times the frequency of a current to be measured. For instance, a frequency of 10 KHz is used for the measurement of currents ranging from DC to low-frequency currents and a frequency of about 100 KHz to 1.5 MHz is used for the measurement of high-frequency currents. Also, the waveform of the AC voltage generated by the AC oscillator 5 may take the form for example of a sawtooth, rectangular, sinusoidal or trapezoidal waveform. In the waveform diagram shown in FIG. 4(a), the output voltage $E_1$ of the AC oscillator 5 shows a case where it takes for example the form of a sawtooth waveform of a peak-to-peak 30 Vpp.

Also, this AC voltage $E_1$ is applied as a bias ac voltage to the coil 4 of the toroidal core 3.

Figure 3:
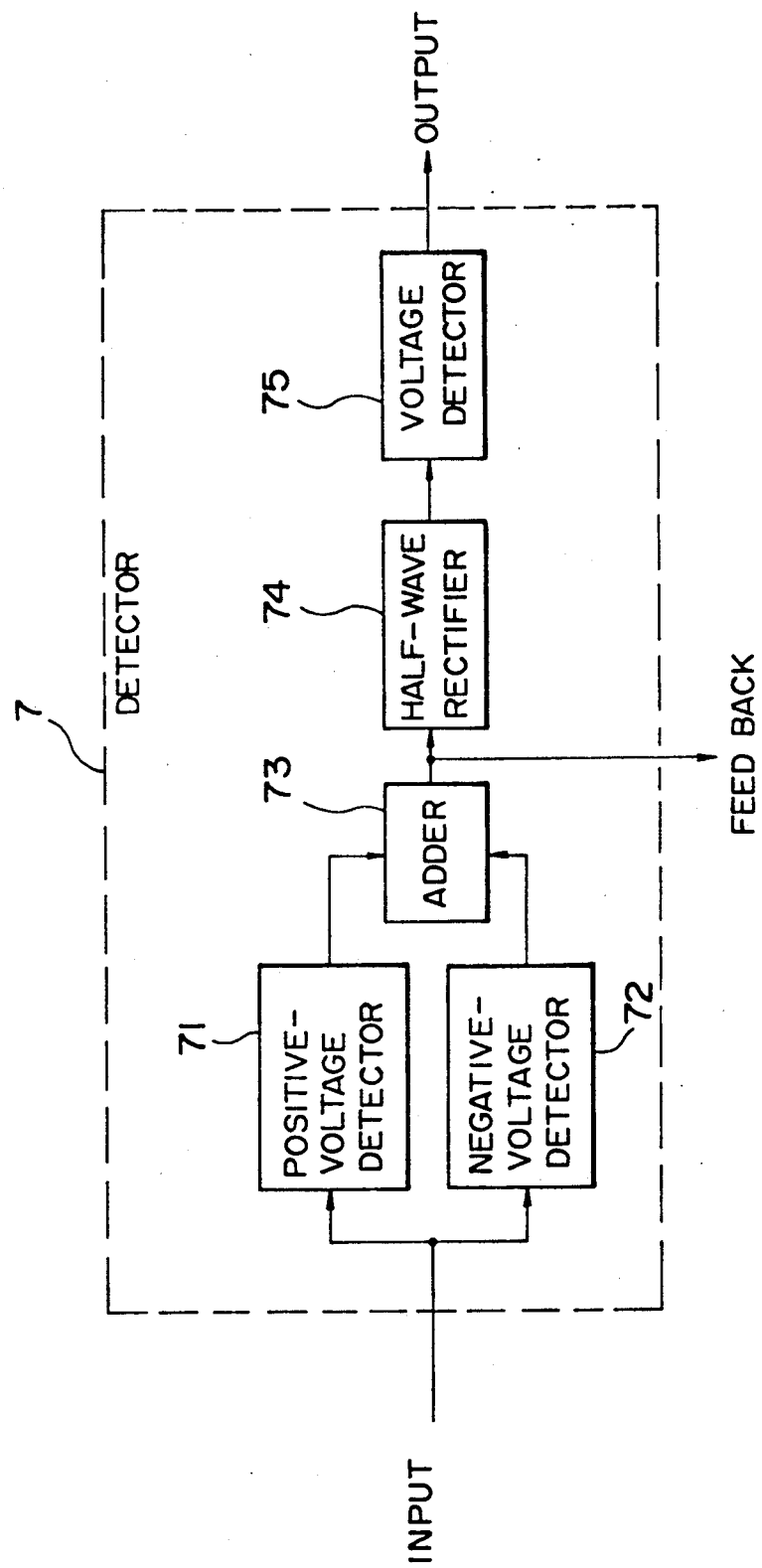
FIG. 3 is a detailed block diagram showing an embodiment of the detector shown in FIG. 2.

FIG. 3 is a detailed block diagram showing an embodiment of the detector shown in FIG. 2, and the detector 7 includes a positive-voltage detector 71, a negative-voltage detector 72, an adder 73, a half-wave rectifier 74 and a voltage detector 75.

Figure 4A:
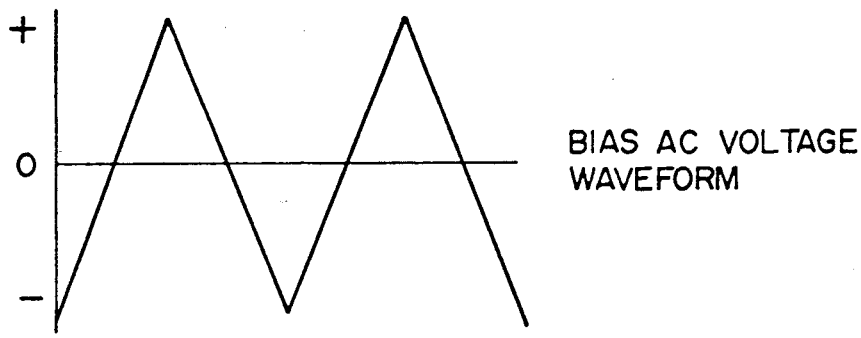
FIGS. 4(a) to 4(c) are waveform diagrams for explaining the operation of the embodiment shown in FIG. 2.
Figure 4B:
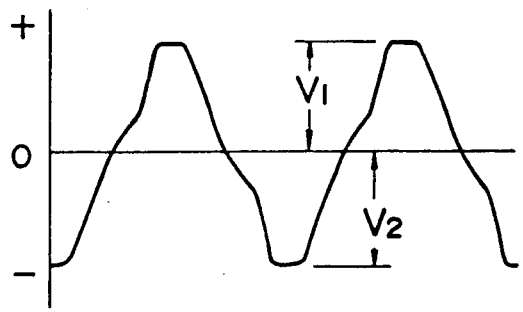
Figure 4C:
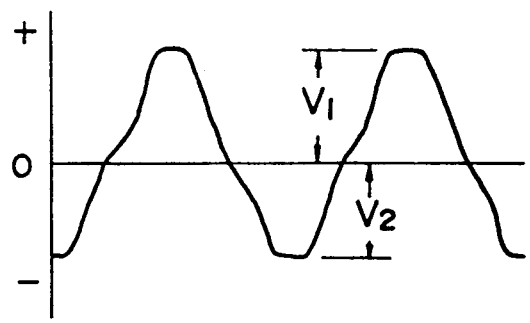

FIGS. 4(a) to 4(c) are waveform diagrams for explaining the operation of the embodiment of FIG. 2.

The operation of the embodiment of FIG. 2 will now be described with reference to FIG. 3 and FIGS. 4(a) to 4(c).

With the current measuring apparatus of the construction described above, the AC voltage E1 generated from the AC oscillator 5, e.g., a sawtooth wave having a frequency of 10 KHz to 100 KHz and a voltage of 30 Vpp, supplies an AC current to the coil 4 of the toroidal core 3 through the adder 9, the series impedance 6 and a terminal P. Thus, an AC voltage E produced by the current flowing in the coil 4 is applied to the input terminal P of the detector 7.

FIG. 4(a) is a diagram showing the waveform of the input to the detector. When a sawtooth voltage having positive and negative polarities and the identical waveforms and amplitudes on the positive and negative sides is applied as a bias AC voltage to the coil 4 of the toroidal core 3 before the current measurement of the invention.

FIG. 4(b) is a diagram showing similarly the waveform of the input to the detector 7 before the current measurement with the toroidal core 3 being in a supersaturation excited condition. In either of the cases of FIGS. 4(a) and 4(b), there is no flow of a current $I_m$ to be measured as yet so that the external magnetic flux is zero and the positive-side and negative-side waveform areas and peak voltage values with respect to zero V (ground point) are the same. They are simply opposite in polarity.

Then, when the current $I_m$ to be measured flow in the conductor 1, the corresponding magnetic flux links with the toroidal core 3 so that in accordance with variations in the intensity of the resulting composite magnetic field within the toroidal core 3, the positive and negative amplitudes of the AC voltage E are varied. These amplitudes are detected by the detector 7 so that the positive and negative amplitudes are compared and the resulting difference is subjected to voltage detection thereby generating an output.

FIG. 4(c) is a diagram showing the waveform of the input to the detector 7 when there is the flow of the current $I_m$ to be measured producing an external magnetic flux. In this case, there is the difference in amplitude between a positive peak voltage $v_1$ and a negative peak voltage $v_2$ in accordance with the value of the external magnetic field (i.e., the value of the current to be measured) and thus this amplitude difference $v_o = v_1 + 8(-v_2)$ can be detected.

In FIG. 3, the positive voltage detector 71 and the negative voltage detector 72 respectively detect the positive component and the negative component of the input voltage through the diodes or the like and also each of them holds the detected peak for substantially the duration of the next half period by a smoothing circuit having a time constant corresponding to the bias AC frequency. As a result, the positive smoothed voltage from the positive voltage detector 71 and the negative smoothed voltage from the negative voltage detector 72 are applied to the adder 73 which in turn generates the resulting difference voltage. Here, these circuits are so adjusted that the difference voltage generated from the adder 73 is reduced to zero before there is the flow of a current to be measured. Then, when the current $I_m$ to be measured is supplied, the output voltages of the positive voltage detector 71 and the negative voltage detector 72 output smoothed voltages modulated with a frequency and amplitude which respectively correspond to the frequency and amplitude of the current $I_m$ to be measured. Thus, as the difference between the two modulated smoothed voltages, only the signal component of the current $I_m$ from which the bias voltage has been removed is generated from the adder 73. Where the current $I_m$ to be measured is a DC current, the output of the adder 73 can be directly delivered as the detected voltage. Also, the output of the adder 73 is delivered for feed back purposes and supplied to the amplifier 8. Where the current $I_m$ is an AC current, however, it must be converted through an AC/DC converter to a DC signal corresponding to the effective value or the peak value of the AC signal. In the present embodiment, the output of the adder 73 of the signal component of the current $I_m$ is subjected to half-wave rectification by the half-wave rectifier 74 and it is then generated as a smoothed DC detected voltage by the voltage detector 75.

An important feature of this detecting method is that since the positive voltage component and the negative voltage component, which are detected from the toroidal core 3, are subjected to the same effect in response to variations in the ambient temperature, it is possible to use a circuit considering temperature compensation for the detector 7 so that the positive and negative voltage component have substantially the same changes and the difference between the two voltages is determined thereby cancelling the changes. In this way, as a matter of principle, it is possible to produce a detected output which is free of the effect due variations in the ambient temperature. Also, even in cases where the current to be measured is a DC current, this detecting method can make measurements satisfactorily.

The output from the adder 73 of the detector 7 is applied to the amplifier 8 which in turn amplifies it to produce an output voltage V corresponding to the current $I_m$ flowing in the conductor 1. By measuring this output voltage V by such indicating means as a voltmeter, it is possible to read the current $I_m$ flowing in the conductor 1 or the current value to be measured.

On the other hand, the output from the adder 73 of the detector 7 is applied to the amplifier 8 which in turn amplifies it to a given value, so that the resulting output voltage V is fed back to the adder 9 and then applied to the coil 4 through the series impedance 6, thereby maintaining the closed loop in the equilibrium condition.

Figure 5:
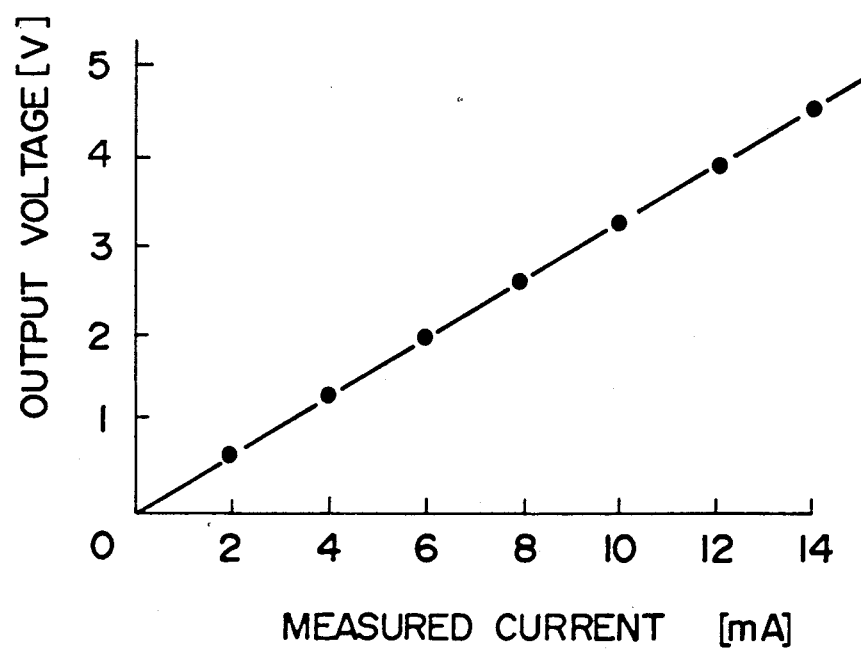
FIG. 5 is a graph useful explaining the operation of the present invention.

Referring now to FIG. 5, there is illustrated a graph showing an example of an actual measurement by the above-mentioned embodiment. In the graph, the abscissa represents the current $I_m$ (mA) to be measured which flows in the conductor 1 and the ordinate represents the output voltage (volts) of the amplifier 8 so that if, for example, the current $I_m$ to be measured is 6 mA, the output voltage V of the amplifier 8 through the detector 7 amounts to 2 volts. Thus, by detecting the output voltage V by the ordinary voltmeter, it is possible to measure the corresponding current $I_m$ flowing in the conductor 1 with greater accuracy.

Figure 6:
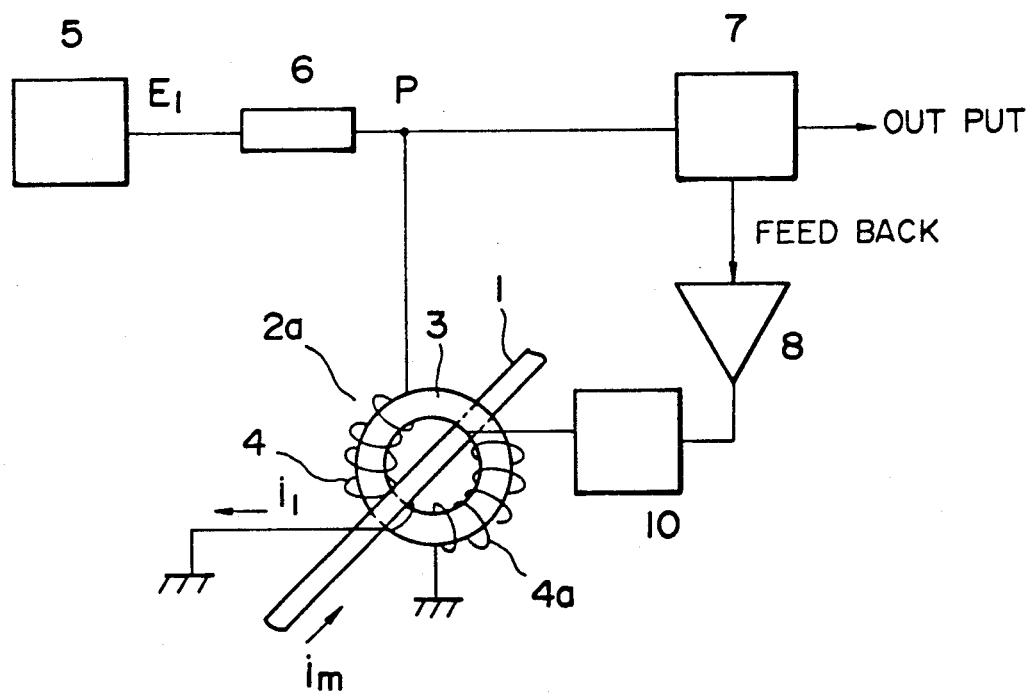
FIG. 6 is a schematic block diagram showing the construction of another embodiment of the present invention.

While the above-described embodiment shows the case in which the output voltage V produced by the current $I_m$ to be measured is fed back to the adder 9, it is possible to modify the embodiment as shown in FIG. 6. In FIG. 6, a first coil 4 and a second coil 4a are wound on the toroidal core 3 so that the output voltage V of the amplifier 8, which is produced by the current $I_m$ flowing in the conductor 1, is supplied to the second coil 4a through a voltage-current converter 10 and the output voltage of the amplifier 8 or the output current of the voltage-current converter 10 is measured, thereby it is possible to measure the current $I_m$ flowing in the conductor 1 highly accurately and stably as in the case of the previously mentioned embodiment.

What is claimed is:

1. Current measuring apparatus comprising:

a magnetic sensor including a toroidal core having a hollow portion through which a conductor is extended for carrying a current to be measured and a first coil wound on said toroidal core;

an AC oscillator for applying an exciting AC voltage to said first coil so as to magnetize said toroidal core to a saturated region;

a detector including a positive voltage detector and a negative voltage detector for respectively detecting an amplitude value of positive voltage and the amplitude value of negative voltage induced in said first coil and a first adder for generating the amplitude value of voltage which is the algebraic sum of said output of said positive voltage detector and that of said negative voltage detector and providing a signal representative of magnetic flux;

an amplifier for amplifying said signal representative of magnetic flux and providing an output signal;

output signal feedback means comprising a second adder for adding said output signal of said amplifier and said exciting AC voltage applied to said coil so as to cancel said change in magnetic flux induced by said current to be measured; and a measuring device for measuring said output signal of said amplifier.

* * * * *